United States Patent
Edmond et al.

(10) Patent No.: US 7,259,402 B2
(45) Date of Patent: Aug. 21, 2007

(54) HIGH EFFICIENCY GROUP III NITRIDE-SILICON CARBIDE LIGHT EMITTING DIODE

(75) Inventors: John Adam Edmond, Cary, NC (US); Jayesh Bharathan, Cary, NC (US); David Beardsley Slater, Jr., Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/951,042

(22) Filed: Sep. 22, 2004

(65) Prior Publication Data

US 2006/0060877 A1    Mar. 23, 2006

(51) Int. Cl.
*H01L 31/02* (2006.01)
(52) U.S. Cl. .......... 257/99; 257/E33.056; 257/E33.066
(58) Field of Classification Search .................. 257/79, 257/99, 100, E33.056–E33.058, E33.075, 257/E33.066; 438/33, 28, 47
See application file for complete search history.

(56) References Cited

U.S. PATENT DOCUMENTS

| | | | |
|---|---|---|---|
| 2,001,622 | A | 5/1935 | McCaa |
| 4,703,219 | A | 10/1987 | Mesquida |
| 4,902,356 | A | 2/1990 | Noguchi et al. |
| 4,912,532 | A | 3/1990 | Cook et al. |
| 5,103,271 | A | 4/1992 | Izumiya et al. |
| 5,376,580 | A | 12/1994 | Kish et al. |
| 5,416,342 | A | 5/1995 | Edmond et al. |
| 5,502,316 | A | 3/1996 | Kish et al. |
| 5,739,554 | A | 4/1998 | Edmond et al. |
| 5,838,706 | A | 11/1998 | Edmond et al. |
| 5,912,477 | A | 6/1999 | Negley |
| 5,985,687 | A | 11/1999 | Bowers et al. |
| 6,071,795 | A | 6/2000 | Cheung et al. |

(Continued)

FOREIGN PATENT DOCUMENTS

EP    1 263 058 A    12/2002

(Continued)

OTHER PUBLICATIONS

Bulman, G.E., et al ; "Nitride Lasers on SiC Substrates," Lasers and Electro-Optics Annual Meeting, ISBN 0-7803-4947-4, IEEE, Dec. 1, 1998, vol. 2, pp. 348-349.

(Continued)

*Primary Examiner*—Matthew C. Landau
(74) *Attorney, Agent, or Firm*—Summa, Allan & Additon, P.A.

(57) ABSTRACT

A method and resulting structures are disclosed for fabricating a high efficiency high extraction light emitting diode suitable for packaging. The method includes the steps of adding a light emitting active portion of wide-bandgap semiconductor material to a conductive silicon carbide substrate, joining the added active portion to a conductive sub-mounting structure, and removing a portion of the silicon carbide substrate opposite the added active portion to thereby reduce the overall thickness of the joined substrate, active portion and sub-mounting structure. The resulting the sub-mounting structure can be joined to a lead frame with the active portion positioned between the silicon carbide substrate and the sub-mounting structure to thereby use the sub-mounting structure to separate the active portion from the lead frame and avoid undesired electrical contact between the active portion and the lead frame.

31 Claims, 11 Drawing Sheets

U.S. PATENT DOCUMENTS

| | | | |
|---|---|---|---|
| 6,100,104 | A | 8/2000 | Haerle et al. |
| 6,120,600 | A | 9/2000 | Edmond et al. |
| 6,187,606 | B1 | 2/2001 | Edmond et al. |
| 6,201,262 | B1 | 3/2001 | Edmond et al. |
| 6,258,699 | B1 | 7/2001 | Chang et al. |
| 6,303,405 | B1 | 10/2001 | Yoshida et al. |
| 6,335,263 | B1 | 1/2002 | Cheung et al. |
| 6,365,429 | B1 | 4/2002 | Kneissl et al. |
| 6,373,077 | B1 | 4/2002 | Edmond et al. |
| 6,403,985 | B1 | 6/2002 | Fan et al. |
| 6,410,940 | B1 | 6/2002 | Jiang et al. |
| 6,410,942 | B1 | 6/2002 | Thibeault et al. |
| 6,420,199 | B1 | 7/2002 | Coman et al. |
| 6,420,242 | B1 | 7/2002 | Cheung et al. |
| 6,448,102 | B1 | 9/2002 | Kneissl et al. |
| 6,459,100 | B1 | 10/2002 | Doverspike et al. |
| 6,465,809 | B1 | 10/2002 | Furukawa et al. |
| 6,468,824 | B2 | 10/2002 | Chen et al. |
| 6,559,075 | B1 | 5/2003 | Kelly et al. |
| 6,562,648 | B1 | 5/2003 | Wong et al. |
| 6,607,931 | B2 | 8/2003 | Streubel |
| 6,610,551 | B1 | 8/2003 | Doverspike et al. |
| 6,635,503 | B2 | 10/2003 | Andrews et al. |
| 6,649,437 | B1 | 11/2003 | Yang et al. |
| 6,657,236 | B1 | 12/2003 | Thibeault et al. |
| 6,664,560 | B2 | 12/2003 | Emerson et al. |
| 6,677,173 | B2 | 1/2004 | Ota |
| 6,716,654 | B2 | 4/2004 | Hsu et al. |
| 6,734,033 | B2 | 5/2004 | Emerson et al. |
| 6,740,604 | B2 | 5/2004 | Kelly et al. |
| 6,740,906 | B2 | 5/2004 | Slater, Jr. et al. |
| 6,747,298 | B2 | 6/2004 | Slater, Jr. et al. |
| 6,757,314 | B2 | 6/2004 | Kneissl et al. |
| 6,786,390 | B2 | 9/2004 | Yang et al. |
| 6,791,119 | B2 | 9/2004 | Slater, Jr. et al. |
| 6,800,500 | B2 | 10/2004 | Coman et al. |
| 6,800,876 | B2 | 10/2004 | Edmond et al. |
| 6,806,112 | B1 | 10/2004 | Horng et al. |
| 6,809,341 | B2 | 10/2004 | Hsu et al. |
| 6,815,312 | B2 | 11/2004 | Furukawa et al. |
| 6,821,804 | B2 | 11/2004 | Thibeault et al. |
| 6,825,501 | B2 | 11/2004 | Edmond et al. |
| 6,846,686 | B2 | 1/2005 | Saeki et al. |
| 6,849,878 | B2 | 2/2005 | Bader et al. |
| 2002/0022290 | A1 | 2/2002 | Kong et al. |
| 2002/0068373 | A1 | 6/2002 | Lo et al. |
| 2002/0121642 | A1 | 9/2002 | Doverspike et al. |
| 2002/0123164 | A1* | 9/2002 | Slater et al. ............ 438/39 |
| 2002/0197764 | A1 | 12/2002 | Uemura et al. |
| 2003/0015721 | A1 | 1/2003 | Slater et al. |
| 2003/0045015 | A1 | 3/2003 | Slater, Jr. et al. |
| 2003/0132701 | A1 | 7/2003 | Sato et al. |
| 2003/0173602 | A1 | 9/2003 | Hsu et al. |
| 2003/0197170 | A1 | 10/2003 | Bader et al. |
| 2004/0004226 | A1 | 1/2004 | Eisert et al. |
| 2004/0012027 | A1 | 1/2004 | Keller et al. |
| 2004/0033638 | A1 | 2/2004 | Bader et al. |
| 2004/0072382 | A1 | 4/2004 | Kelly et al. |
| 2004/0124429 | A1 | 7/2004 | Stokes et al. |
| 2004/0135158 | A1 | 7/2004 | Hon |
| 2005/0006669 | A1 | 1/2005 | Mishra et al. |

FOREIGN PATENT DOCUMENTS

| | | |
|---|---|---|
| JP | 61059886 | 3/1986 |
| JP | 11238913 | 8/1999 |

OTHER PUBLICATIONS

Windisch R, et al; "40% Efficient Thin-Film Surface-Textured Light-Emitting Dios by Optimization of Natural Lithography," IEEE Transactions on Electron Devices, ISSN: 0018-9383, vol. 47 No. 7, Jul. 2000 pp. 1492-1498.

Nakamura S, et al; "Superbright Green Ingan Single-Quantum-Well-Structure Light-Emitting Diodes," Japanese Journal of Applied Physics, ISSN: 0021-4922, vol. 34., No. 10B, Part 2, Oct. 15, 1995, pp. L1332-L1335.

Harle et al., Advanced Technologies for High Efficiency GaInN LEDs for Solid State Lighting, Third Intl. Conference on Solid State Lighting, Proc. of SPIE, vol. 5187, 2004.

Koike et al., Development of High Efficiency GaN-based Multiquantum-Well Light Emitting Diodes and their Applications, IEEE, vol. 8 No. 2, Mar.-Apr. 2002.

Kuo et al., Nitride-based Near-Ultraviolet LEDs with an ITO Transparent Contact, Materials Science and Engineering, vol. B106, pp. 69-72, 2004.

Gardner et al., High-Flux and High Efficiency Nitride-Based Light Emitting Diodes, IEEE, pp. 641-642, 2002.

Craford, M. George, Visible LEDs: The Trend Toward High Power Emitters and Remaining Challenges for Solid State Lighting, Solid State Lighting II, Proc. of SPIE, vol. 4776, 2002.

Niki et al., White LEDs for Solid State Lighting, Third International Conference on Solid State Lighting, Proc. of SPIE, vol. 5187, 2004.

Tadamoto et al., High Output Power Near-Ultraviolet and Violet Light-Emitting Diodes Fabricated on Patterned Sapphire Substrates Using Metalorganic Vapor Phase Epitaxy, Third Intl. Conference on Solid State Lighting, Proc. of SPIE, vol. 5187, 2004.

Mukai et al., Recent Progress of Nitride-Based Light Emitting Devices, Phys. Stat. Sol. vol. 200, No. 1, pp. 52-57, 2003.

Mukai et al., GaN-based Light-Emitting Diodes Suitable for White Light, Light Emitting Diodes: Research, Manufacturing, and Applications VII, Proc. of SPIE, vol. 4996, 2003.

Morita et al., Over 200 mW on 365 nm Ultraviolet Light Emitting Diode of GaN-free Structure, Phys. Stat. Sol., vol. 200, No. 1, pp. 114-117, 2003.

United Epitaxy Company, Ltd., Specifications Confirmation Letter, 4713DC AlInGaN Blue LED Chip, 2003.

LABSPHERE, The Radiometry of Light Emitting Diodes-Technical Guide.

Epitech Technology Corporation, Traffic Green LED Chip, Dec. 2003.

Seoul Semiconductor Co. Ltd., AlInGaN LED DICE, 2003.

Epitech Technology Corporation, Near Blue LED Chip, Dec. 2003.

Unity Opto Technology Co., Ltd., AlGaAs/GaAs High Power T-1 3/4 Package Infrared Emitting Diode, Nov. 17, 2000.

Nichia Corporation, White LED Analysis, Mar. 17, 2004.

Instrument Systems, LED Station, MAS 40 Turn-key System for LED Testing.

* cited by examiner

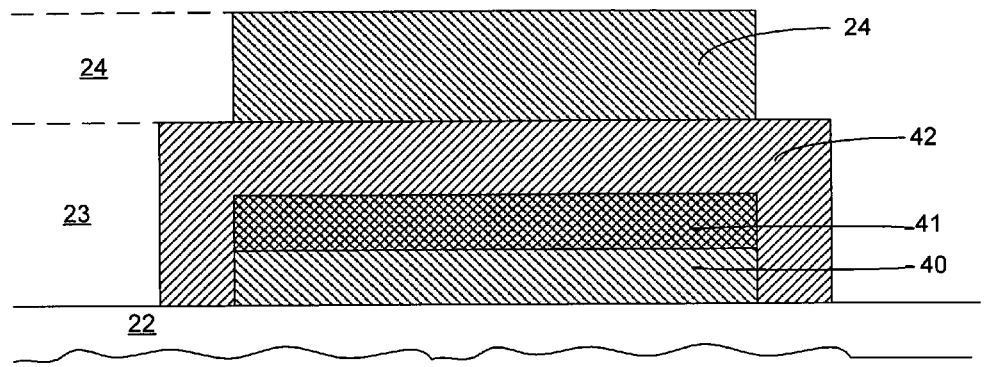
Fig. 15
Fig. 16
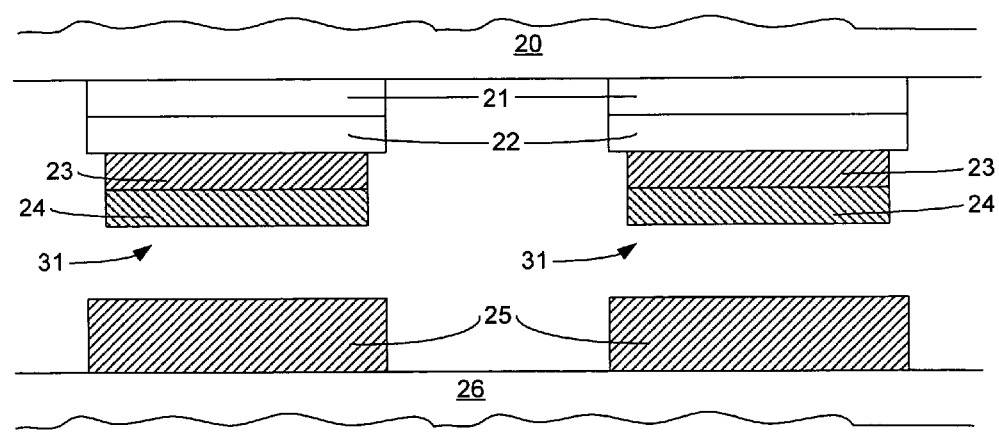

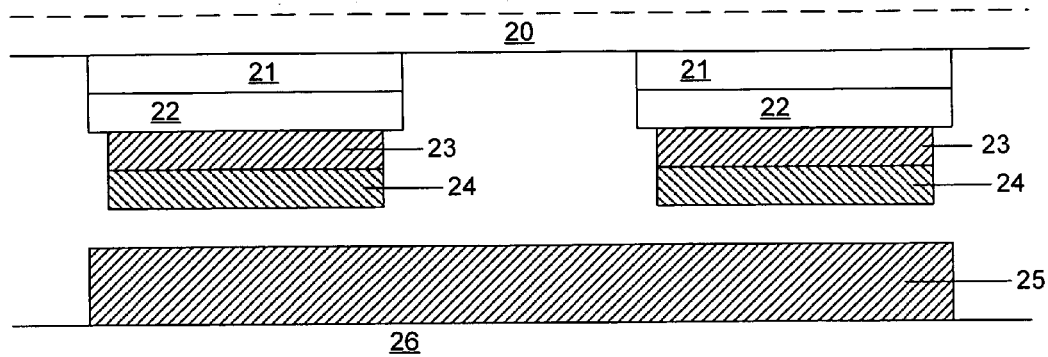
Fig. 17
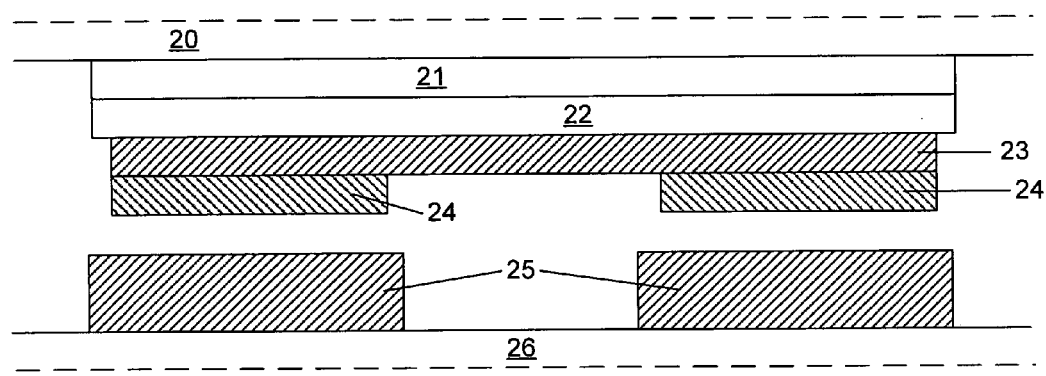
Fig. 18
Fig. 19
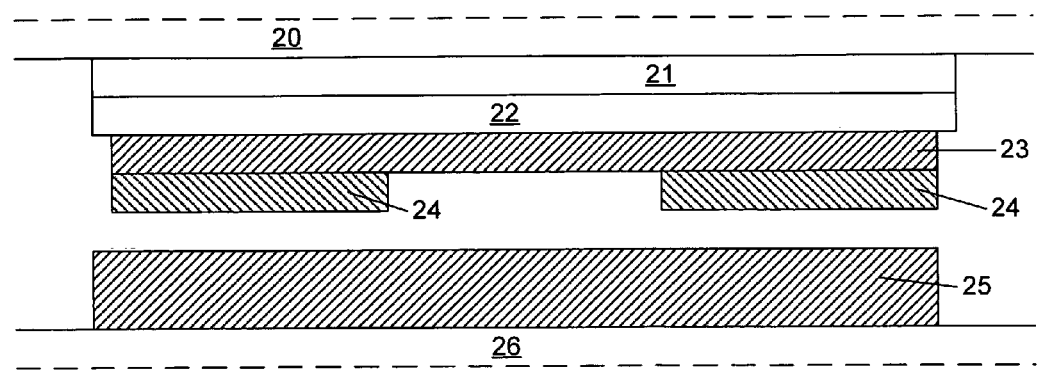

HIGH EFFICIENCY GROUP III NITRIDE-SILICON CARBIDE LIGHT EMITTING DIODE

BACKGROUND

The present invention relates to light emitting diodes ("LEDs") and in particular relates to high-brightness light emitting diodes formed from Group III nitride active structures on silicon carbide substrates.

In general, light emitting diodes represent one class of photonic devices that are commercially well-established for numerous applications. For the first few decades of the semiconductor era, however, such light emitting diode applications (although numerous and successful) were limited to relatively low-intensity applications such as indicator lights or small displays (e.g., handheld calculators). One reason for such limited application was based in the available semiconductor materials, most typically silicon (Si) and gallium arsenide (GaAs). Basically, and as well-understood in this art, a light emitting diode emits light based upon the recombination of electrons and holes under the influence of an applied bias across a p-n junction. Because the frequency (and thus the wavelength) of emitted light is directly related to the energy of the transition leading to the recombination ($E=h\nu$), the frequency of light emitted by a light emitting diode is based upon (and ultimately limited by) the material's bandgap.

In that regard, GaAs has a bandgap of 1.4 electron volts (eV). Accordingly, the highest-energy transitions that GaAs can produce are in the red, orange and yellow portions of the visible spectrum.

A number of commonly assigned patents and co-pending patent applications likewise discuss the theory and nature of light emitting diodes, including but not limited to U.S. Pat. Nos. 6,459,100; 6,373,077; 6,201,262; 6,187,606; 5,912,477; 5,416,342; and 5,838,706; and Published U.S. Applications Nos. 20020022290; 20020093020; and 20020123164. The contents of these are incorporated entirely herein by reference.

In order to further commercialize light emitting diode applications, however, colors other than red, orange and yellow must be available. Specifically blue and green light emitting diodes are required (along with red diodes) to create white light or full color displays. Because these colors represent higher-energy portions of the visible spectrum, they require larger transitions than the bandgaps of silicon or gallium arsenide can provide. Thus, in the last two decades, significant interest has been developed—and progress generated—in a wider bandgap materials such as silicon carbide (2.99 eV for the 6H polytype) and the Group III nitride's (e.g., 3.36 eV for gallium nitride). The Group III nitrides are particularly preferred because they are "direct" (and thus higher-efficiency) emitters.

In addition to providing blue, green, or white light (as well as emissions in the ultraviolet range), the Group III nitride light emitting diodes have the potential to provide replacement for long-standing illumination technologies such as incandescent and fluorescent lighting. In comparison to such mature technologies, light emitting diodes ("solid-state lighting") are longer-lasting, physically more rugged, use less power, and are more efficient. Historically, however, LEDs have lacked brightness comparable to incandescent, fluorescent or vapor-discharge lights and thus these older technologies have continued to occupy the field. Only recently, have white LEDs (or LED-based white-emitting devices) begun to make inroads into commercial lighting applications, with most of these being in smaller applications such as flashlights and related items.

It will be understood of course that a single diode will not produce a white emission because white light is a combination of non-white frequencies. In some LED applications, however, a blue or UV-emitting LED can be used in conjunction with a phosphor to produce white light from a single diode source.

In commercial embodiments of light emitting diodes (e.g., the XBRIGHT™ diodes offered by the assignee herein; Cree, Inc.; Durham, N.C.) recent advances have included an inverted device design. U.S. Pat. No. 6,740,906 discusses aspects of this design as does U.S. Patent Application Publication No. 20020123164. The contents of both of these are incorporated entirely herein by reference. In this type of design, the Group III active layers are grown (typically epitaxially) on a silicon carbide substrate. Light emitting diodes of this type are then mounted with their epitaxial layers ("epilayers") "down" rather than "up"; i.e., the silicon carbide portions forms the display face of the mounted device while the epitaxial layers are mounted to and face a circuit or wiring most typically referred to as a "lead frame" that provides the electrical connection to the diode. The silicon carbide-up orientation increases light extraction from the device as set forth in the '906 patent and the '164 publication.

Silicon carbide can also be conductively doped. This provides advantages in comparison to sapphire based Group III nitride diodes. Because sapphire is an insulator, two top wire bonds are typically required to mount a working sapphire-based diode. In comparison, silicon carbide devices can be "vertically" oriented; i.e., with ohmic contacts on opposite ends of the device. Such vertical orientation is directly analogous to diodes formed in other conductive semiconductor materials such as gallium arsenide (GaAs), and thus the same mounting orientations and techniques can be used.

Although these "inverted" devices have successfully provided significant practical and commercial improvements, their "epilayer-down" orientation requires different, and to some extent more sophisticated, mounting on lead frames. In particular, because the active portion (p-n junction, multiple quantum well, etc.) is positioned closely adjacent to the lead frame, avoiding short circuits or other undesired interactions between the active portion and lead frame becomes more difficult.

For example, conventional LEDs (including Group III nitride on SiC devices) are often mounted on the lead frame using conductive silver epoxy. Silver epoxy is a mixture of more than about 50 percent by weight of microscopic silver particles with epoxy resin precursors. When used to connect electronic devices to circuits (or circuit boards) the silver epoxy provides flexibility, relative ease of handling, conductivity and good heat transfer properties. Because silver epoxy is (purposely) applied as a viscous liquid, it can and will flow accordingly and, unless other steps are taken, will tend to surround lower portions of any diode mounted with it. As noted above, if the active portions are adjacent the lead frame, the flowing silver epoxy can contact the active portion and cause short circuiting or other undesired interactions.

As a result, many conventional light emitting diode mounting techniques are either too difficult, too unreliable or simply unavailable for inverted Group III nitride silicon carbide devices. Other specific techniques (e.g., application Ser. No. 10/840,463 filed May 5, 2004 and now published as Patent Application Publication No. 20050029533) should or must be incorporated to avoid these problems.

As another potential solution, the inverted device can be positioned on some sort of sub-structure, with the sub-structure being attached to the lead frame. Examples include U.S. Patent Application Publication No. 20030213965. The sub-structure is included to add sufficient thickness to remove the active portions farther from the lead frame and its silver epoxy or related materials. As set forth in No. 20030213965, however, soldering the device to a substructure can undesirably tilt the device with respect to the sub-structure and thereby exacerbate the short-circuiting problem.

As another problem, the extra thickness resulting from the presence of the substructure is also a disadvantage, because manufacturers of end-use products frequently demand smaller and smaller—including "thinner"—light emitting diodes. Such demand includes, for example, flat-panel displays on small devices such as cellular phones and personal digital assistants ("PDAs").

Accordingly, it remains a continuing goal to increase the current capacity, light output (power) and light extraction (geometry) capabilities of inverted light emitting diodes while concurrently reducing their size and particularly reducing their thickness. It remains a similar goal to produce such diodes in designs that can be conveniently incorporated into lead frames, packages and circuits in a manner similar or identical to related diodes.

SUMMARY

In one aspect, the invention is a wafer structure for high-efficiency inverted chip light emitting diode precursors. The wafer structure comprises a conductive silicon carbide substrate wafer, at least one light-emitting active layer on the substrate, at least one metal contact layer on the light emitting layer, a conductive sub-mounting structure on the metal contact layer, a plurality of ohmic contacts on the surface of the conductive silicon carbide substrate that is opposite from the light emitting active layer, and with the ohmic contacts defining a plurality of light emitting diode precursors.

In another aspect the invention is a method of fabricating and mounting a light emitting diode for high efficiency and extraction. In this aspect, the method comprises adding a light emitting active portion of wide-bandgap semiconductor material to a conductive silicon carbide substrate, joining the added active portion to a conductive sub-mounting structure, and removing a portion of the silicon carbide substrate opposite the added active portion to thereby reduce the overall thickness of the joined substrate, active portion and sub-mounting structure. The resulting sub-mounting structure can be joined to a lead frame with the active portion positioned between the silicon carbide substrate and the sub-mounting structure to thereby use the sub-mounting structure to separate the active portion from the lead frame and avoid undesired electrical contact between the active portion and the lead frame.

In yet another aspect the method comprises adding a light emitting active layer of wide-bandgap semiconductor material to a conductive silicon carbide substrate wafer, adding at least one metal contact layer to the added active layers, joining the metal contact layer to a conductive sub-mounting wafer, removing a portion of the silicon carbide substrate wafer opposite the added active layers to thereby reduce the overall thickness of the joined wafers, adding ohmic contacts to the reduced silicon carbide substrate wafer and to the sub-mounting wafer to thereby define a plurality of individual diode precursors, separating the diode precursors into individual diodes, and joining the sub-mounting portion of the separated diodes to respective lead frames with the active layers positioned between the silicon carbide substrate and the sub-mounting structure to thereby use the sub-mounting structure to separate the active layers from the lead frame and avoid undesired electrical contact between the active layers and the lead frame.

In yet another aspect, the method comprises adding a light emitting active layer of wide-bandgap semiconductor material to a conductive silicon carbide substrate wafer, joining the added active layer to a conductive sub-mounting wafer, adding ohmic contacts to the reduced silicon carbide substrate wafer and to the sub-mounting wafer to thereby define a plurality of individual diode precursors, separating the diode precursors into individual diodes, and joining the sub-mounting portion of the separated diodes to respective lead frames with the active layers positioned between the silicon carbide substrate and the sub-mounting structure to thereby use the sub-mounting structure to separate the active layers from the lead frame and avoid undesired electrical contact between the active layers and the lead frame.

The foregoing and other objects and advantages of the invention and the manner in which the same are accomplished will become clearer based on the followed detailed description taken in conjunction with the accompanying drawings.

BRIEF DESCRIPTION OF THE DRAWINGS

FIGS. 1 through 19 are schematic cross-sectional illustrations of the method steps of the invention and the resulting structures.

In a broad sense the invention is an aluminum indium gallium nitride based light emitting region sandwiched between a semiconducting or conducting substrate and a thin silicon carbide layer. When mounted, the conducting substrate forms the bottom of the device and this bottom portion has a thickness adequate to allow the use of epoxy pastes for chip attachment into a package. The upper silicon carbide layer is thin enough to limit the final device thickness to less than about 150 μm, which is adequate for most surface mount light emitting diode applications. This results in a thin, high-brightness light emitting diode chip with low forward voltage that can be attached by the manufacturer with standard electrically conducting epoxy pastes and that has a single wire bond on top. The design results in a more Lambertian emitting pattern. As a result, coupling to a phosphor for conversion to white light is expected to be more efficient over the use of currently available silicon carbide-based chips. The invention also allows for increasing size without the loss of efficiency.

The invention has application for light emitting diode displays, indicators, light conversion, small and large chips, and any other light emitting diode applications.

Certain method aspects of the invention are illustrated in FIGS. 1 through 19. Although FIGS. 1-19 do not illustrate every conceivable step, and although the method can be described in fewer steps then illustrated in FIGS. 1-19, it will be understood that FIGS. 1-19 provide the skilled person with the information necessary to practice the information without undue experimentation. Similarly, FIGS. 1-19 are schematic, and not to scale.

Figure 1:

FIG. 1 illustrates that the method can be described as starting with a conductive silicon carbide wafer 20, preferably n-type, upon which the desired or necessary active layers are then fabricated. As will be described further herein, FIG. 1 illustrates a "thick" silicon carbide wafer 20 which will later be trimmed for purposes to be described herein. As used herein, the term "thick" refers to a wafer with a thickness on the order of about 250-500 µm. Alternatively, the method could start with a "thinner" wafer having a thickness of about 75-125 µm. A thicker wafer provides greater structural strength during a number of the steps described herein. Alternatively, the use of a thinner wafer, although less mechanically robust, can eliminate the steps described herein in which the substrate thickness is reduced.

Figure 2:
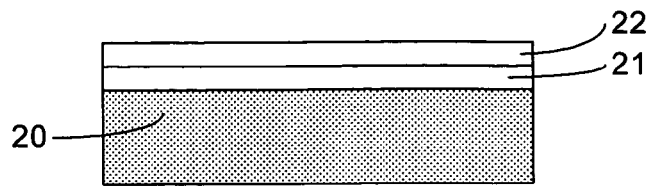

FIG. 2 illustrates two epitaxial active layers 21 and 22 as added to the substrate 20. In preferred embodiments these layers are n-type (21) and p-type (22) respectively. It will be understood, of course, that a number of different arrangements of one or more active layers (i.e., those layers in which the light-generating transitions occur) can be incorporated in devices of this type and that the illustrated active layer structure, although exemplary, is not limiting of the invention and that additional layers or and combinations of layers can be incorporated. Such layers and combinations can include buffer layers (usually adjacent the silicon carbide substrate), contact layers (e.g. p-GaN layers that enhance ohmic behavior at p-side contacts), and more complex active structures such as multiple quantum wells and superlattice structures. As used herein, the term "active layer structure" refers to a semiconductor structure that emits light when a current is applied. Typically, but not exclusively, some form of p-n junction structure is included. FIG. 2 illustrates two layers (one p-type and one n-type) as being a basic junction structure for an LED.

Figure 3:
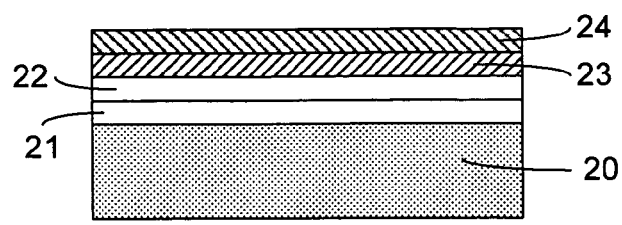

FIG. 3 illustrates the addition of one or more respective metal layers to the junction (epitaxial) side of the device. Two metal layers 23 and 24 are illustrated and it will be understood that these can be selected as desired or necessary from among those metals (or alloys or layered combinations of metals) that are best for light reflection and ohmic contact purposes in conjunction with the Group III nitride active layers 21 and 22. It will be understood that although two metal layers 23, 24 are illustrated, such is exemplary rather than limiting of the invention and the number of layers can be increased for various purposes as desired or necessary consistent with the other objects of the invention. In this regard, FIGS. 15-19 expand upon the description of the metal layers. As another example, and as will be described with respect to FIG. 8, this metal-deposition step can include the step of adding an etch-stop metal.

Figure 4:
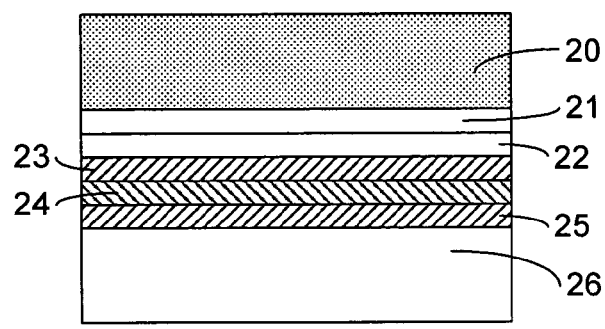

FIG. 4 is inverted with respect to FIG. 3 in order to illustrate the next step in which the device side of the structure is mounted to a second conductive wafer 26 or an equivalent multi-layer or composite structure. The second conductive wafer 26 is preferably attached to the metal layers 23 and 24 using a solder bond illustrated at 25 using pressure and heat with a solder layer 25 being first deposited on either the original wafer 20 (adjacent the metal layers 23 and 24) or on the second wafer 26 or both (e.g. FIGS. 16-19). The purpose of the second substrate wafer 26 is to support the structure for later mounting and grinding and to form a portion of the final device structure. Thus the wafer 26 must be sufficiently thick to serve this purpose, with presently preferred thicknesses being on the order of about 250 µm. It will be understood, however, that in a manner analogous to the original silicon carbide wafer 20, the second substrate wafer 26 can also be a thin wafer to start with, for example, on the order of 75 to 100 µm.

If both the original conductive wafer 20 and the second substrate wafer 26 are "thin" to start with, it will be understood that neither will need to be trimmed any further in the following steps described herein. Thinner substrates are, however, weaker in accordance with well understood principles of mechanical strengths of objects with respect to their geometric sizes and proportions. Thus, the use of "thicker" wafers combined with thinning steps is presently preferred.

Figure 5:
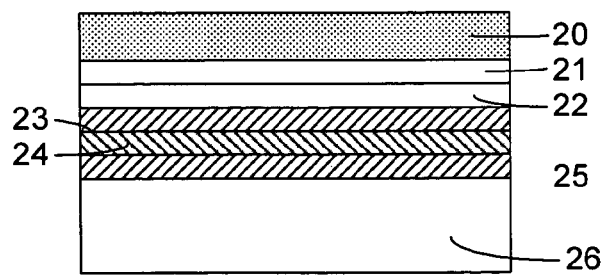

FIG. 5 illustrates the structure after the original silicon carbide substrate 20 has been mechanically thinned to a desired thickness, which is presently on the order of about 1-50 µm. As just noted, the process (e.g., FIGS. 1-4) can start with a thin substrate that acquires no further reduction. In preferred embodiments, however, the original silicon carbide wafer 20 has a thickness sufficient to ease the fabrication steps illustrated in FIGS. 1 through 4.

Figure 6:
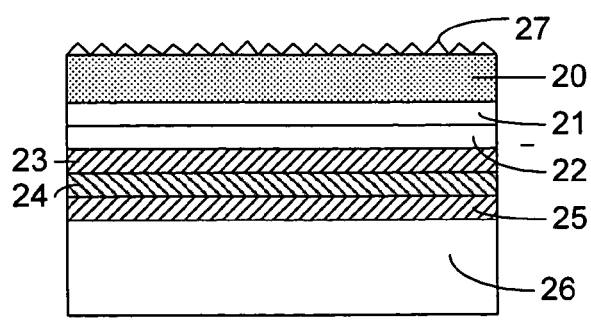

FIG. 6 illustrates an optional embodiment of the device in which the thinned silicon carbide substrate 20 is shaped or textured to produce a lenticular surface 27 for desired light extraction purposes. A number of texturing options are set forth in previously incorporated Patent Application Publication No. 20020123164 and thus will not be described in further detail herein. These can, however, be practiced by those of skill in this art without undue experimentation.

Figure 7:
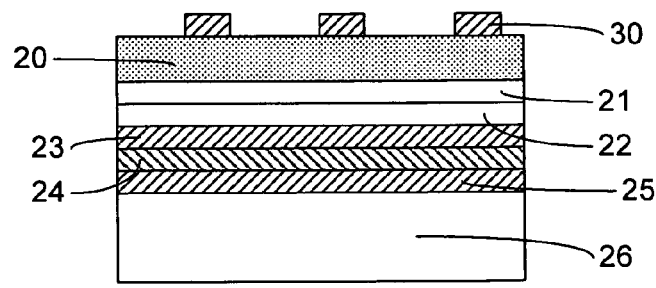

As illustrated in FIG. 7, in the next step a plurality of ohmic contacts 30 representing a plurality of device precursors are added to the side of the silicon carbide substrate 20 opposite the epilayers 21 and 22. It will be understood that if the original substrate 20 carries a textured surface 27, then the portion of the substrate 20 underneath the ohmic contacts 30 need not carry such texturing.

Figure 8:
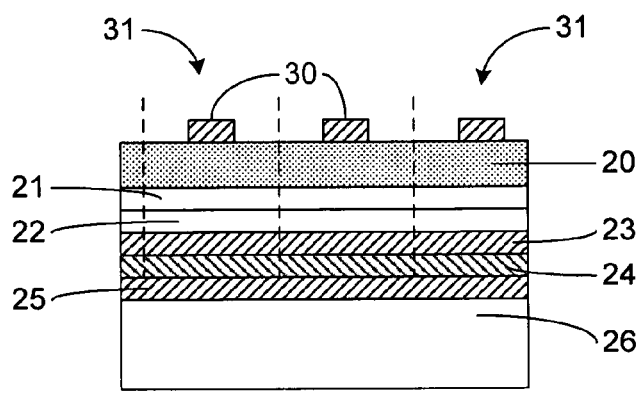

FIG. 8 schematically illustrates (with the vertical dotted lines) the step of dividing the original silicon carbide substrate wafer 20 into individual device precursors that are broadly designated at 31. The dividing step can be carried out by any appropriate technique that otherwise avoids interfering with the remaining process steps or with the resulting precursors or the finished devices. Exemplary methods include mechanical sawing, laser cutting, etching and water-jet cutting. Each of these is generally well-understood and can be practiced without undue experimentation by those of ordinary skill in this art. FIG. 8 also illustrates that, if desired, an etch stop layer can be included when the metal layers 23 and 24 are originally added (FIG. 3) to help control the depth and distance to which the etch is carried in the step illustrated in FIG. 8. Such an etch stop layer is conductive and can be formed from an appropriate conductive oxide such as indium tin oxide (typically $In_2O_3$/$SnO_2$). Although the scale and schematic nature of FIG. 8 do not illustrate an etch-stop layer per se, one exemplary position would be between the layers illustrated at 24 and 25 in FIG. 8.

Additionally, although not illustrated in these schematic Figures, the divided edges of the device precursors 31 that result from the etching, can be passivated (typically with silicon oxide or silicon nitride) to isolate and protect the junctions or other necessary portions of the active layers 21 and 22.

As another option that is not illustrated at this point in these drawings, the ohmic contact that is later illustrated as 33 in FIG. 11 can be added at this step provided that no subsequent thinning of the second substrate wafer 26 is required or carried out.

Figure 9:
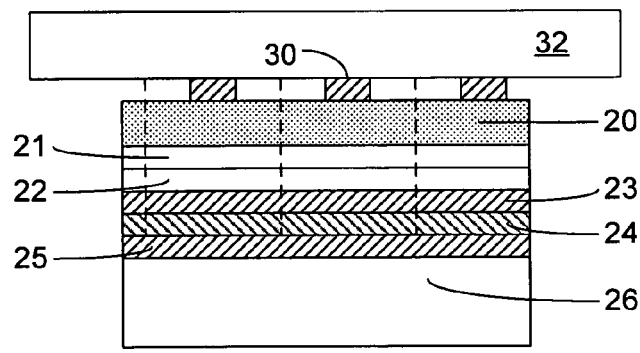

FIG. 9 illustrates the next step in which the original substrate 20 side of the composite structure is attached to a temporary carrier 32. The temporary carrier 32 can be any structure that serves the intended purpose without otherwise interfering with the other method steps or with the resulting device precursors or devices. Typically, the temporary carrier 32 comprises a planar support that is sufficiently rigid for the task and that carries a temporary (i.e., releasable) bonding media. The temporary carrier 32 can comprise another substrate or grinding tape, both of which are widely available and well understood in this art and can be practiced without undue experimentation.

Figure 10:
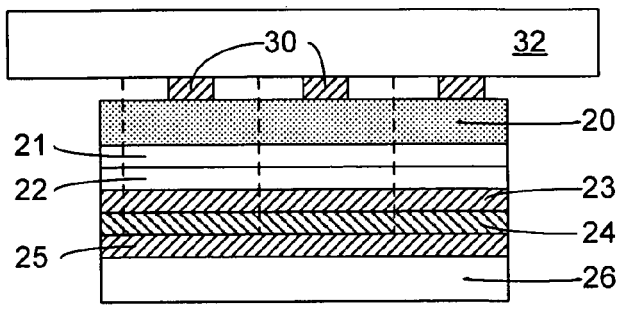

FIG. 10 illustrates that the purpose of adding the temporary carrier is to provide the opportunity for thinning the second conductive wafer 26 (or an equivalent composite structure) to the desired thickness of between about 75 and 125 μm. Although the Figures are schematic, a comparison between FIG. 4 and FIG. 10 also illustrates a significant reduction in the overall thickness of the structure formed by and between the substrates 20 and 26.

Figure 11:
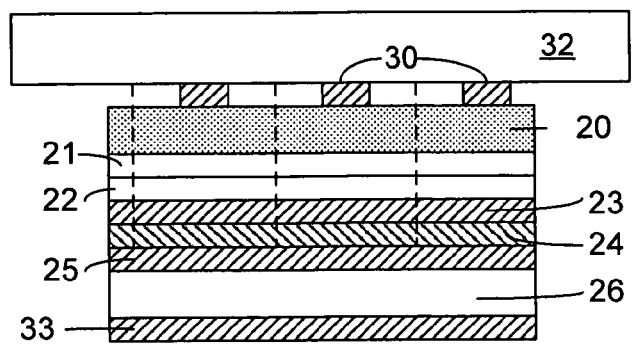

FIG. 11 illustrates the step of forming an ohmic contact 33 to the second substrate 26 (or its equivalent structure). The selection of metals for the ohmic contact and the method of forming the ohmic contact are generally well understood in this art and can be selected as desired provided that they are functionally consistent with the remainder of the method steps described herein.

Figure 12:
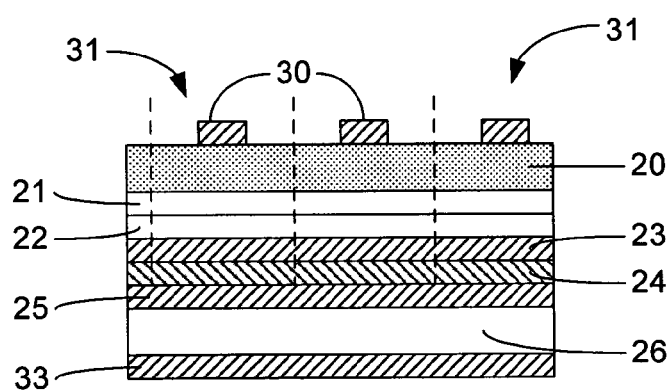

FIG. 12 illustrates the composite structure and the device precursors 31 after they have been removed from the temporary carrier 32. When the composite structure is in the stage of manufacture illustrated in FIG. 12, the individual devices are tested, typically by probing in a manner well understood in this art to either confirm their operation or to identify those that (for whatever reason) were not formed correctly and will not operate. Those of ordinary skill in this art are well aware, of course, that on a typical wafer that can include dozens, hundreds, or even thousands of device precursors, the failure of a small percentage is entirely normal and expected under typical manufacturing conditions.

Figure 13:
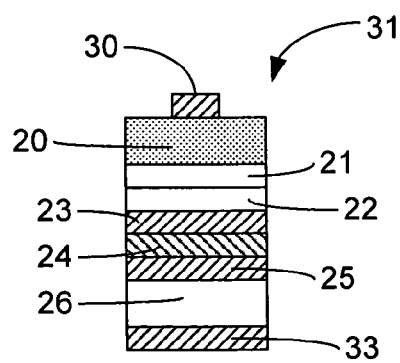

FIG. 13 illustrates the last step in which the devices are separated into individual diode structures one of which is broadly designated as 31.

In another aspect, the invention is a wafer structure for high-efficiency inverted chip light emitting diode precursors. In this aspect, the invention comprises the conductive silicon carbide substrate wafer 20, with at least one light-emitting active layer on the substrate wafer. FIG. 2 illustrates two such layers at 21 and 22. At least one metal contact layer is on the light emitting layer and FIG. 3 illustrates an embodiment with two metal layers 23 and 24 on the epitaxial layer 22. A conductive sub-mounting structure 26 (FIG. 4) is on the metal contact layer, and is typically selected from the group consisting of metals and semiconductors, with silicon carbide being preferred.

In preferred embodiments the sub-mounting structure includes yet another metal solder layer 25 for attaching the sub-mounting structure to the silicon carbide wafer 20 and its epitaxial and metal layers. The metal layers can also be or include a mirror layer (i.e., a highly reflective metal) and can include etch stop metals for the purposes described with respect to the method aspects of the invention.

A plurality of ohmic contacts 30 are on the surface of the conductive silicon carbide substrate that is opposite from the light emitting active layers 21 and 22, with the ohmic contacts defining a plurality of light emitting diode precursors broadly designated at 31. Similarly, and as illustrated in FIGS. 11 and 12, the conductive sub-mounting structure carries another ohmic contact 33 opposite from the metal contact layers 23 and 24.

In a related embodiment that is schematically illustrated in FIGS. 8-12, the conductive silicon carbide substrate wafer 20, the light-emitting active layers 21 and 22 and the metal contact layers 23 and 24 are physically separated into individual device precursors while the sub-mounting wafer 26 remains intact. This permits a passivation composition (not shown in FIGS. 8-12) to be added along the edges of the separated individual device precursors In preferred embodiments, the conductive silicon carbide substrate wafer 20 is a single crystal and has a polytype selected from the group consisting of the 3C, 4H, 6H and 15R polytypes of silicon carbide. Similarly, the light-emitting active layers are Group III nitrides, with aluminum indium gallium nitride ($Al_xIn_yGa_{1-x-y}N$, where $0 \leq x,y \leq 1$) being particularly preferred, and indium gallium nitride ($In_yGa_{1-y}N$, exclusive of y=0) being most preferred.

In the preferred embodiments the silicon carbide single crystal wafer 20 is no more than 25 microns thick between the ohmic contacts 30 and the active layers 21 and 22 active portion, and in the most preferred embodiments, the total dimension between and including the ohmic contacts 30 and 33 is no more than 100 microns.

Figure 14:
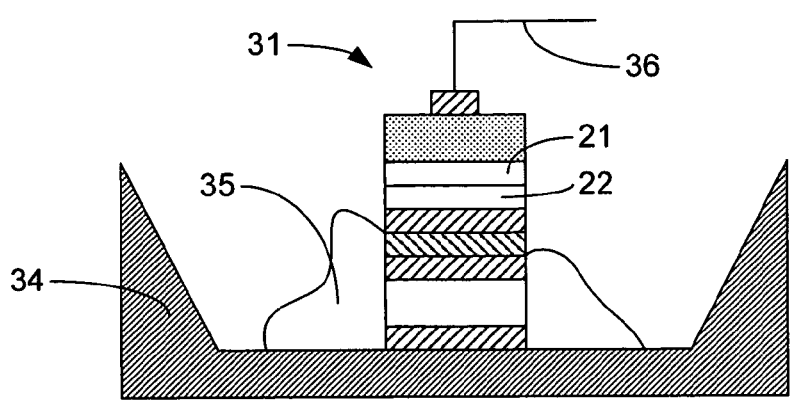

FIG. 14 is a schematic cross-sectional view of an individual diode 31 formed according to the method of the invention as just described and mounted for use. As with the other illustrations, it will be understood that FIG. 14 is a schematic illustration and is not to scale. Furthermore, those of ordinary skill in this art will understand the more specific aspects of such a device and its mounting. In FIG. 14, the diode 31 is mounted on an appropriate lead frame 34 which is formed of a conductive material, usually a silver-coated metal, and which provides the initial electrical connection to an appropriate circuit. As discussed in the Background, the diode 31 is typically held in place, at least partially, by a conductive epoxy 35 which includes conductive particles, often of (or coated with) silver (Ag). As FIG. 14 illustrates, the active layers 21, 22 are positioned sufficiently above the lead frame 34 to minimize or eliminate the possibility that the silver epoxy 35 will contact the active layers 21, 22 during or after mounting, thus preventing the possibility of undesired current paths or short circuiting.

In order to illustrate the sequence of the method aspects of the invention, FIG. 4 omits certain details and options that can be included. Some of these details and options are illustrated in FIGS. 15-19.

First, FIG. 15 illustrates details about the metal layers 23 and 24. For purposes of comparison to the other Figures herein, FIG. 15 broadly indicates the layers 23 and 24 using dashed lines and the position of the semiconductor layer 22 by the curved line. As FIG. 15 illustrates, in preferred embodiments metal layer 23 is a three layer structure formed by a layer of platinum (Pt) that forms an ohmic contact 40.

The platinum ohmic contact layer 40 is preferably thin enough to be transparent; i.e. it transmits at least fifty percent (50%) of incident light. A silver (Ag) mirror layer 41 for light reflection is on the ohmic contact 40, and a barrier layer 42 not only covers, but also surrounds the ohmic contact and mirror layers 40, 41. As persons skilled in the metallurgy and semiconductor arts are well aware, silver tends to migrate among and between, and then react relatively quickly with, certain other metals and semiconductor materials. In the present invention, such migration is highly undesirable and thus the tin layer 42 is included to prevent silver from migrating beyond the mirror layer 41 and to similarly prevent the metal layer 24 from reacting with the silver mirror layer 41.

Other metals can be included in this portion of the structure, either in place of or in addition to those already described. For example, the barrier layer 42 can be formed of multiple layers, each of which can be a single metal or combination or alloy of two or more metals. In preferred embodiments, the barrier layer 42 is formed of such combinations or alloys of titanium, tungsten and platinum. The metals described with respect to FIG. 15 are thus exemplary rather than limiting of the invention.

With the ohmic contact layer 40 and the mirror layer 41 in place and encapsulated by the barrier layer 42, FIG. 15 further illustrates that the other metal layer 24 is on the barrier layer 42. In preferred embodiments the metal layer 24 is an alloy of gold (Au) and tin (Sn) for providing both excellent electrical conductivity and a secure bond when the original substrate and device (e.g. FIG. 3) are brought together with the second substrate 26 and its metal layer 25 (e.g. FIG. 4).

FIGS. 16-19 are included to illustrate that the entirely planar structure illustrated in FIG. 4 is only one option and that diode precursors 31 can be formed as mesas before the first and second substrates 20, 26 and their respective structures, are joined to one another.

In FIG. 16, the diode precursors 31 are mesas formed of the metal layers 23 and 24 and the semiconductor layers 21 and 22. In a similar manner, the metal layer 25 on the second substrate 26 can be formed as a plurality of mesas that correspond to, and can be aligned with, the diode precursors 31 on the first substrate 20. Partially or completely separating the device precursors 31 can, in certain circumstances, help prevent the later full separating step (e.g. FIG. 13) from adversely affecting the metal layers 23 and 24 and the semiconductor layers 21 and 22. For example, if mechanical sawing is the desired separation technique, creating the mesas first will help prevent the sawing action from mechanically affecting the metals and semiconductor layers in a fashion that damages or destroys their resulting end structure and function. As a more specific example, mechanical sawing can, in certain circumstances, carry the metals into undesired contact with the semiconductor materials creating inadvertent and undesired Schottky contacts (e.g. FIG. 29).

In FIG. 17, the precursors are again formed as mesas, but the metal layer 25 on the second substrate 26 remains as a full planar layer.

In FIG. 18, only the metal layer 24 forms the mesa on the first substrate 20 while the metal layer 25 on the second substrate 26 is again formed as mesa.

Finally, in FIG. 19, all of the layers are planer except for metal layer 24 which again forms mesas as in FIG. 18.

As further noted elsewhere, the vertical structure of the resulting device (ohmic contacts at opposite ends rather than facing the same direction) permits the use of a single wire contact 36 for completing the electrical connections to the diode 31.

FIGS. 20 through 24 illustrate additional advantages of the invention. Each of these represents intensity measured in microwatts per square centimeter ($\mu W/cm^2$) plotted on a radial graph against the angle of measurement, with 0° representing the measurement from directly above the center of the diode. All of the measurements were taken using the mini-goniophotometer of an MAS 40 LED Station from Instrument Systems Optische Messtechnik (with North American offices at Instrument Systems Canada, 1960 Scott St., Suite 302 K1Z 8L8, Ottawa, Ontario, Canada) and with the results plotted using the IS-SPECWIN™ software from the same company.

Figure 20:
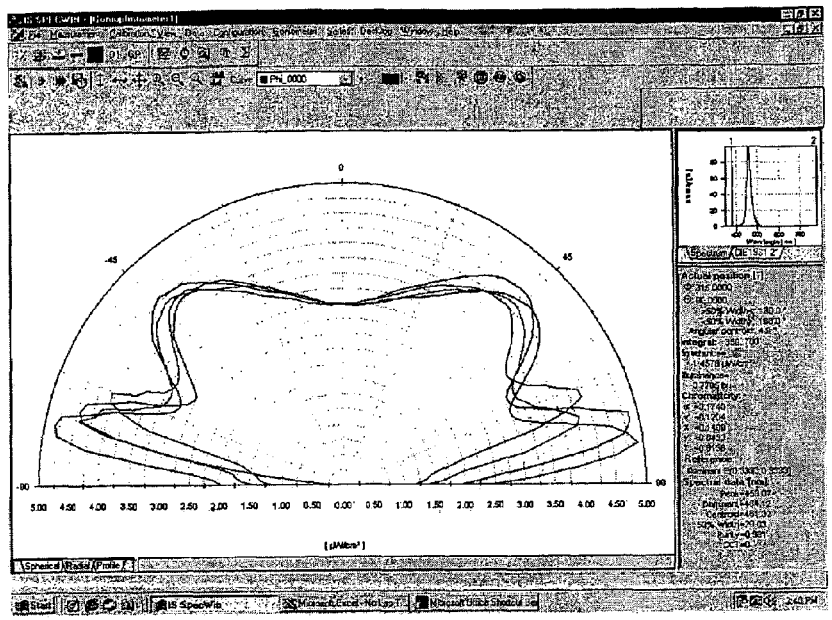
FIG. 20 is an emission plot taken from a current commercially-available diode in which the silicon carbide substrate forms the emission face.

FIG. 20 illustrates an emission pattern representative of existing inverted chip designs and in particular represents the emission pattern of an XBRIGHT™ chip from Cree, Inc. of Durham, N.C., the assignee of the present invention. Although the intensity is excellent in some directions, FIG. 20 illustrates that the flux density is non-uniform (and not Lambertian) and thus highly dependent upon the direction of emission or (in complementary fashion) of observation. The diode measured and plotted in FIG. 20 had a peak omission of 459 nm with a dominant wavelength of 464 nm with a full width at half maximum (FWHM) of 20 nm.

In comparison, FIGS. 21 through 24 illustrate emission patterns of several light emitting diodes according to the present invention. Each of FIGS. 21 through 24 illustrates a significant improvement in the uniformity of flux density as compared with the existing devices (FIG. 20).

Figure 21:
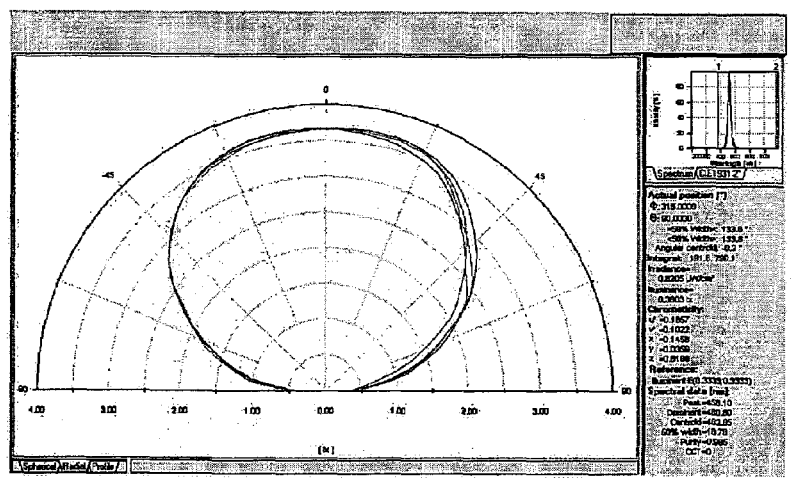
FIGS. 21 through 24 are corresponding emission plots taken from diodes according to the present invention.

FIG. 21 illustrates the emission pattern of a diode according to the present invention with a conventional straight cut, with a planar rather than a lenticular surface and without any bevels. The measured diode had a peak omission at 456 nanometers with a dominant portion at 461 nm and a FWHM of 19 nm.

Figure 22:
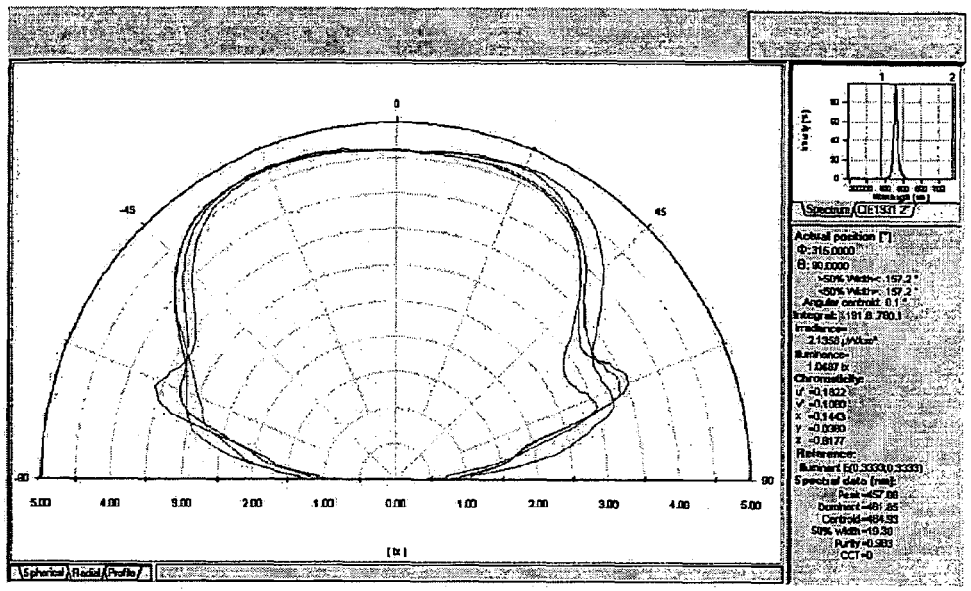

FIG. 22 illustrates the emission pattern of a diode according to the present invention with a beveled edge cut and a planar, rather than lenticular, surface. The measured diode had a peak output of 457 nm, a dominant wavelength of 462 nm, and a FWHM of 19 nm.

Figure 23:
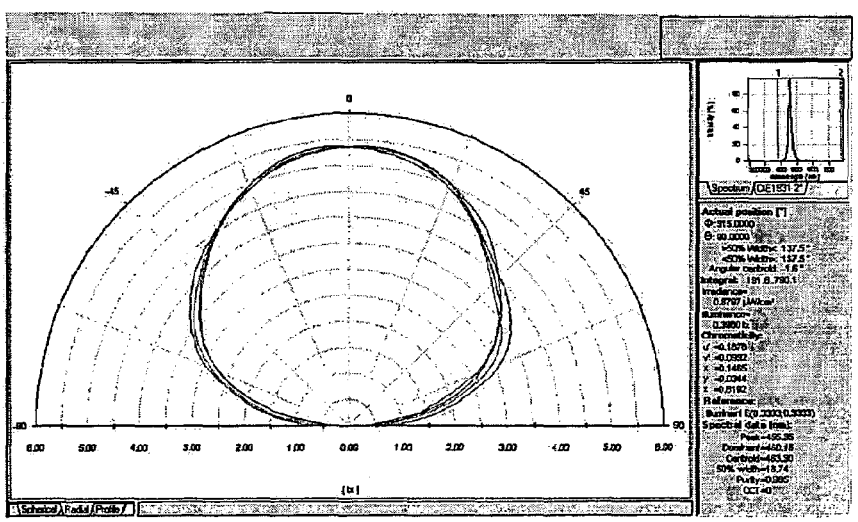

FIG. 23 illustrates the emission pattern of a diode with a lenticular surface and straight cut edges. The measured diode had a peak wavelength of 455 nm, a dominant wavelength of 460 nm, and a FWHM of 19 nm.

Figure 24:
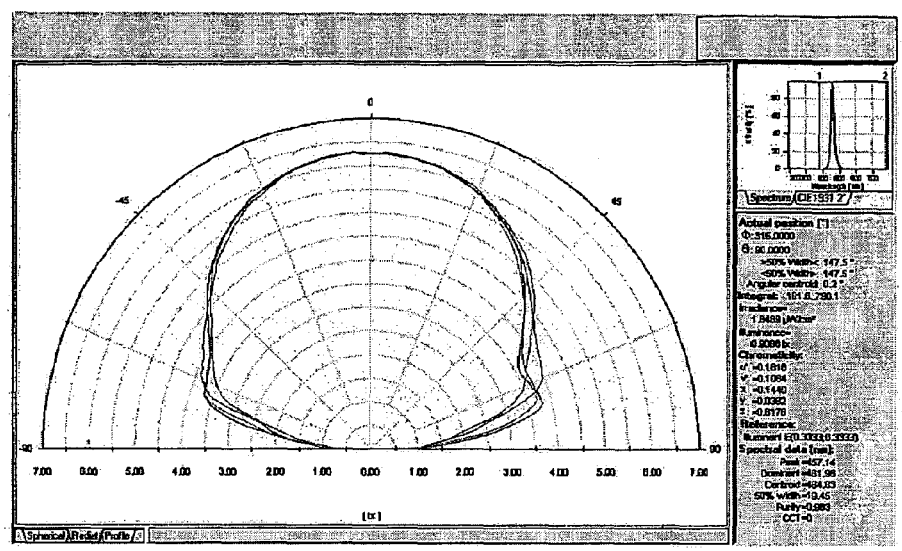

FIG. 24 illustrates the emission pattern of a diode according to the present invention with a lenticular surface and beveled edges. The measured diode had a peak wavelength of 457 nm, a dominant wavelength of 462 nm, and a FWHM of 19.6 nm.

FIGS. 25 through 33 are scanning electron microscope (SEM) photographs of a diode according to the present invention and certain of its portions.

Figure 25:
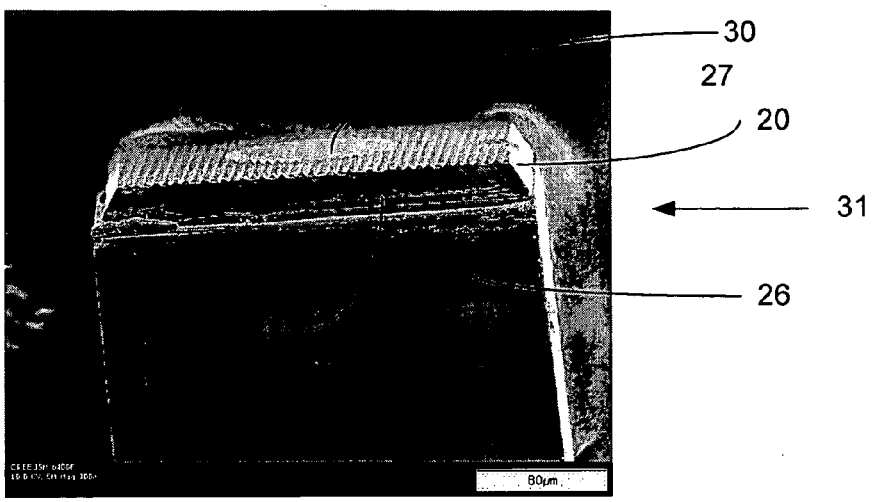
FIGS. 25-29 and 31-33 are scanning electron microscope (SEM) photographs of diode portions illustrating aspects of the present invention.

The SEM photograph of FIG. 25 illustrates a diode (at 300× magnification) corresponding to the schematic structure broadly designated at 31 in FIG. 13, but with the thickness of the second substrate 26 not having been reduced. For reference purposes, the original substrate 20 is labeled as such in FIG. 25 as is the ohmic contact 30. The diode includes a lenticular surface 27 and beveled edges 44, both for desired light-extraction purposes. The active layers 21 and 22 and the metal layers 23, 24 and 25 are not entirely visible in FIG. 25 because they form a mesa (e.g. FIGS. 16 and 17) the edges of which are underneath the substrate 20.

Figure 26:
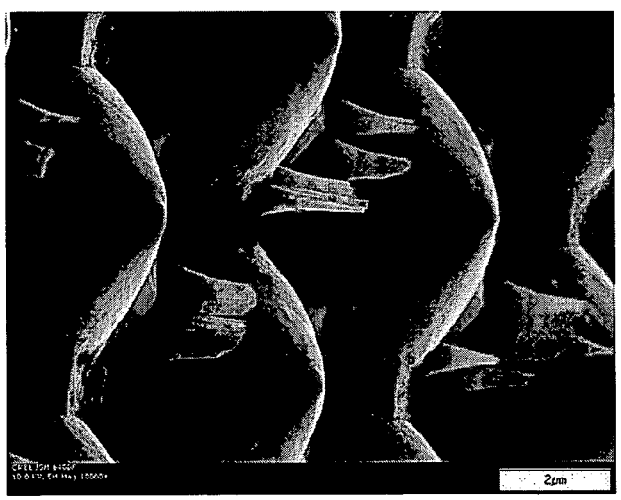
Figure 27:
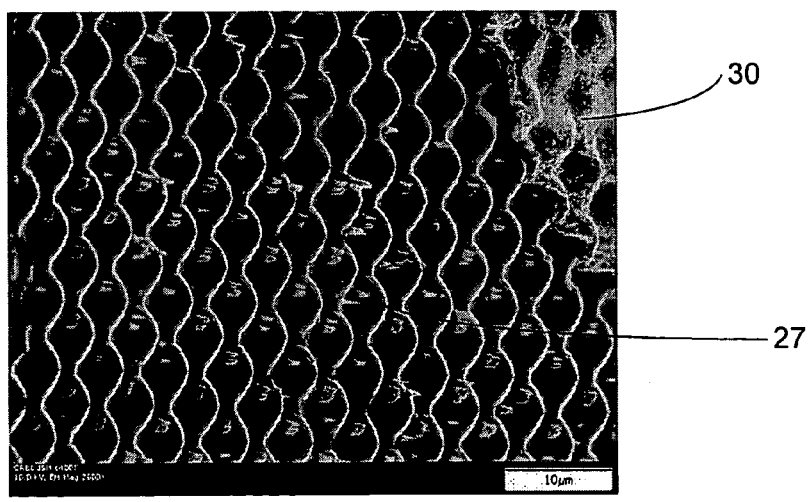

FIGS. 26 and 27 are illustrations, taken at different magnifications, of one type of lenticular surface (27 in FIG.

6) of the diode illustrated in FIG. 25. A portion of the ohmic contact 30 also appears in FIG. 27.

Figure 28:
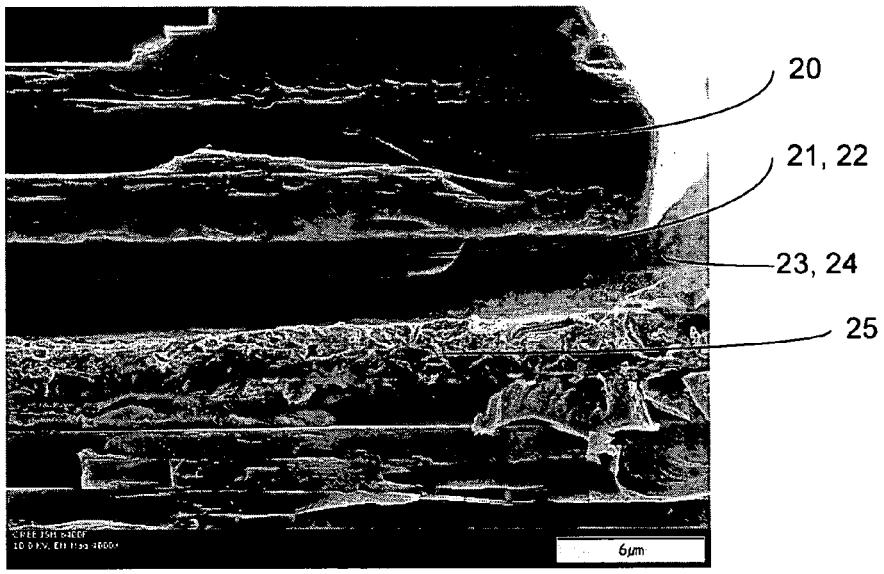

FIG. 28 is a larger magnification (4000×) of an upper right hand edge portion of the diode of FIG. 25. The original substrate 20 forms the top portion of FIG. 28 and the mesa formed of the active layers 21 and 22 is visible immediately below the original substrate 20. Portions of the metal and solder layers 23, 24 and 25 are shown extending towards the edge of the diode.

Figure 29:
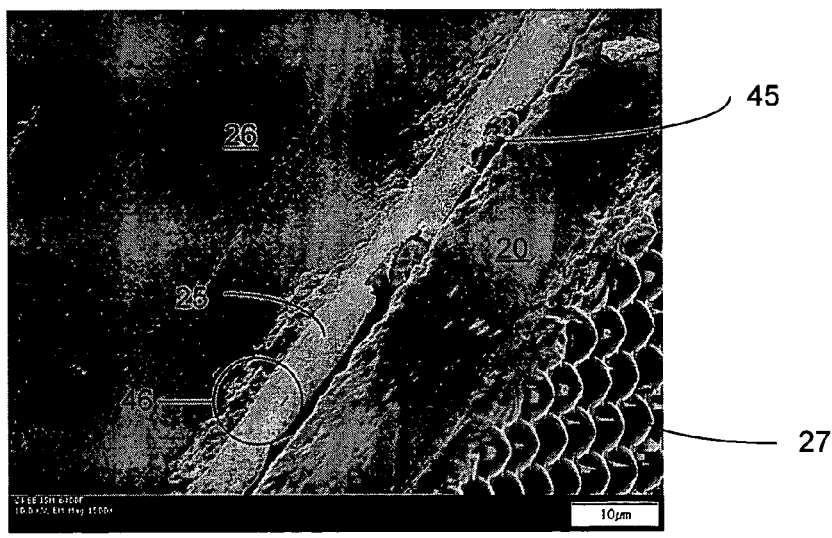
Figure 30:
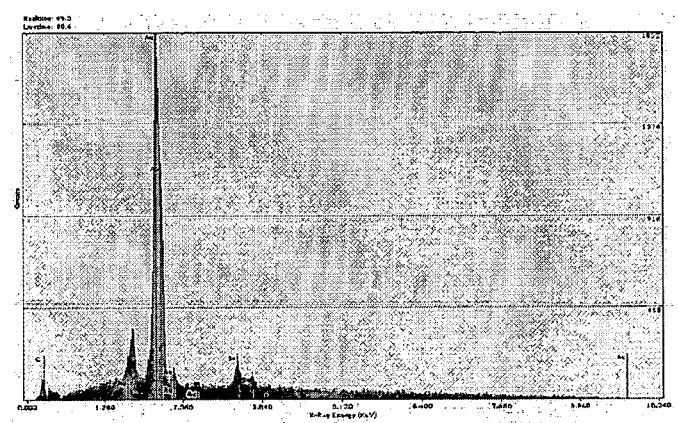
FIG. 30 is an x-ray spectrum corresponding to an analysis of portions of the diode illustrated in FIG. 29.

FIG. 29 is yet another SEM photograph of a diode according to the present invention and shows the lenticular surface 27, the original substrate 20, the second substrate 26, and the solder layer 25. FIG. 29 also illustrates that if the metal layers are not joined properly, portions of gold and tin illustrated at 45 may migrate (or be forced) from their intended locations and come into direct contact with the substrate 20 to thus form undesired Schottky contacts. This can be confirmed with an x-ray spectrum such as illustrated in FIG. 30 which is taken generally in the position circled at 46 in FIG. 27. The x-ray spectrum confirms the presence of both gold and tin at this undesired position.

Figure 31:
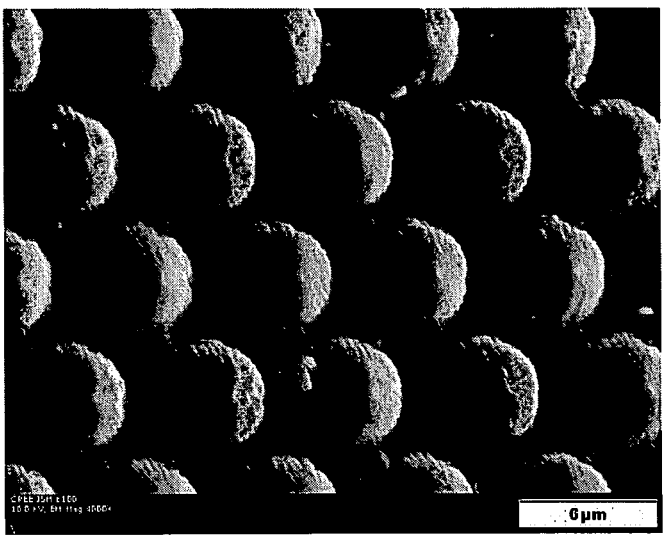
Figure 32:
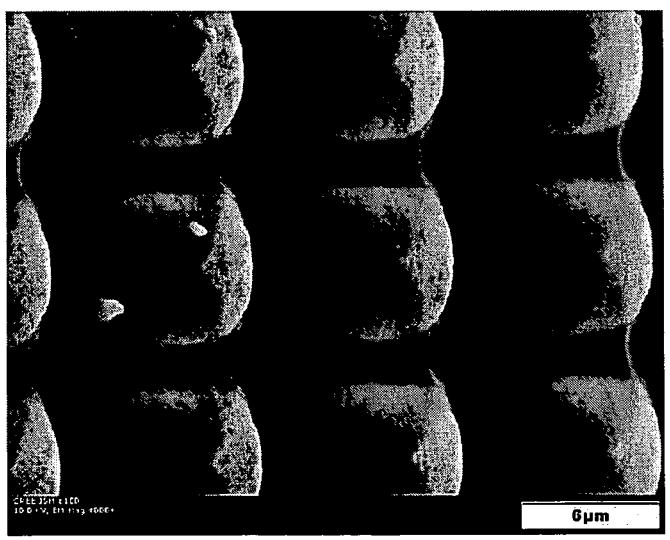
Figure 33:
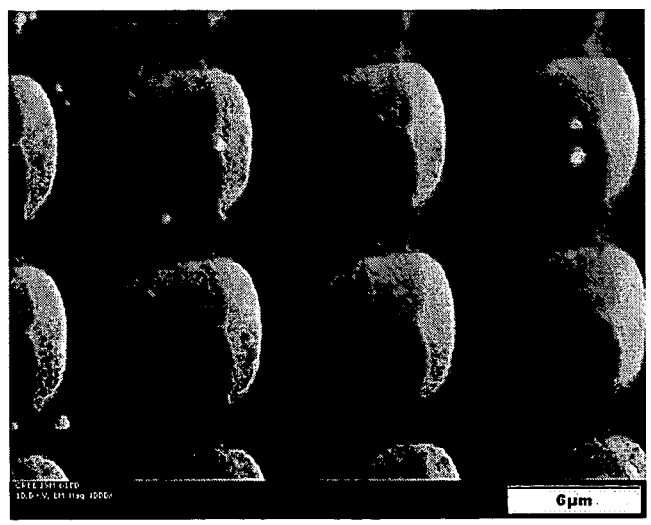

FIGS. 31, 32 and 33 illustrate alternative versions of the lenticular surface 27 of the diode 31. In FIG. 31 the lenticular surface has a positive elliptical shape, in FIG. 32 a positive pyramid shape, and in FIG. 33 an off-center positive pyramid shape. The lenticular surface can be formed using techniques otherwise well understood in the art such as masking and patterning with photoresist, lasers, inductive coupling plasmas, or reactive ion etching, or can be embossed with a mask pattern and then selectively patterned with reactive ion etching.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A wafer structure for high-efficiency inverted chip light emitting diode precursors, said wafer structure comprising:
   a conductive silicon carbide substrate wafer;
   at least one light-emitting active layer on said substrate;
   at least one metal contact layer on said light emitting layer;
   a conductive silicon carbide sub-mounting wafer structure on said at least one metal contact layer;
   a plurality of ohmic contacts on the surface of said conductive silicon carbide substrate wafer that is opposite from said light emitting active layer, said ohmic contacts defining a plurality of light emitting diode precursors.

2. A wafer structure according to claim 1 wherein said conductive silicon carbide substrate wafer is a single crystal and has a polytype selected from the group consisting of the 3C, 4H, 6H and 15R polytypes of silicon carbide.

3. A wafer structure according to claim 1 wherein said light-emitting active layer is a Group III nitride.

4. A wafer structure according to claim 1 wherein said light-emitting active layer is indium gallium nitride.

5. A wafer structure according to claim 1 comprising a plurality of metal contact layers.

6. A wafer structure according to claim 1 wherein said plurality of metal contact layers comprises:
   a solder layer for joining said conductive silicon carbide substrate wafer to said conductive sub-mounting structure;
   a silver layer for providing a mirror that enhances light extraction; and
   a baffler layer on and surrounding said silver layer for preventing silver from said silver layer from migrating beyond said silver layer.

7. A wafer structure according to claim 6 wherein said baffler layer is selected from the group consisting of platinum, tungsten and titanium and layers and alloys thereof.

8. A wafer structure according to claim 5 wherein at least one metal contact layer is a mirror.

9. A wafer structure according to claim 5 comprising at least one conducting etch-stop layer.

10. A wafer structure according to claim 1 wherein said conductive sub-mounting structure is selected from the group consisting of metals and semiconductors.

11. A wafer structure according to claim 1 wherein said conductive sub-mounting structure comprises a composite of at least two different materials.

12. A wafer structure according to claim 1 comprising an ohmic contact on said conductive sub-mounting structure opposite from said metal contact layer.

13. A wafer structure according to claim 12 having a total dimension between and including said ohmic contacts of no more than 100 microns.

14. A wafer structure according to claim 1 wherein said conductive silicon carbide substrate wafer is no more than 25 microns thick between said ohmic contacts to said wafer and said active layer on said wafer.

15. A wafer structure according to claim 1 wherein said conductive silicon carbide wafer has a lenticular surface for increasing the light extraction from diodes separated from said wafer structure.

16. A wafer structure for high-efficiency inverted chip light emitting diode precursors, said wafer structure comprising:
   a conductive silicon carbide substrate wafer;
   at least one light-emitting active layer on said substrate;
   at least one metal contact layer on said light emitting layer;
   a conductive sub-mounting structure on said at least one metal contact layer;
   a plurality of ohmic contacts on the surface of said conductive silicon carbide substrate wafer that is opposite from said light emitting active layer, said ohmic contacts defining a plurality of light emitting diode precursors; and
   an ohmic contact on said conductive sub-mounting structure opposite from said metal contact layer.

17. A wafer structure according to claim 16 wherein said conductive silicon carbide substrate wafer is a single crystal and has a polytype selected from the group consisting of the 3C, 4H, 6H and 15R polytypes of silicon carbide.

18. A wafer structure according to claim 16 wherein said light-emitting active layer is a Group III nitride.

19. A wafer structure according to claim 16 wherein said light-emitting active layer is indium gallium nitride.

20. A wafer structure according to claim 16 comprising a plurality of metal contact layers.

21. A wafer structure according to claim 16 wherein said plurality of metal contact layers comprises:
   a solder layer for joining said conductive silicon carbide substrate wafer to said conductive sub-mounting structure;

a silver layer for providing a mirror that enhances light extraction; and a baffler layer on and surrounding said silver layer for preventing silver from said silver layer from migrating beyond said silver layer.

22. A wafer structure according to claim 21 wherein said barrier layer is selected from the group consisting of platinum, tungsten and titanium and layers and alloys thereof.

23. A wafer structure according to claim 20 wherein at least one metal contact layer is a mirror.

24. A wafer structure according to claim 20 comprising at least one conducting etch-stop layer.

25. A wafer structure according to claim 16 wherein said conductive sub-mounting structure is selected from the group consisting of metals and semiconductors.

26. A wafer structure according to claim 16 wherein said conductive sub-mounting structure comprises a silicon carbide wafer.

27. A wafer structure according to claim 16 wherein said conductive sub-mounting structure comprises a composite of at least two different materials.

28. A wafer structure according to claim 16 comprising an ohmic contact on said conductive sub-mounting structure opposite from said metal contact layer.

29. A wafer structure according to claim 28 having a total dimension between and including said ohmic contacts of no more than 100 microns.

30. A wafer structure according to claim 16 wherein said conductive silicon carbide substrate wafer is no more than 25 microns thick between said ohmic contacts to said wafer and said active layer on said wafer.

31. A wafer structure according to claim 16 wherein said conductive silicon carbide wafer has a lenticular surface for increasing the light extraction from diodes separated from said wafer structure.

* * * * *

UNITED STATES PATENT AND TRADEMARK OFFICE
CERTIFICATE OF CORRECTION

PATENT NO. : 7,259,402 B2 Page 1 of 1
APPLICATION NO. : 10/951042
DATED : August 21, 2007
INVENTOR(S) : John Adam Edmond, Jayesh Bharathan and David Beardsley Slater, Jr.

It is certified that error appears in the above-identified patent and that said Letters Patent is hereby corrected as shown below:

In the Claims:

Claim 6 at Column 12, line 3: delete "baffler" and insert -- barrier --
Claim 7 at Column 12, line 7: delete "baffler" and insert -- barrier --
Claim 21 at Column 13, line 3: delete "baffler" and insert -- barrier --

Signed and Sealed this

Sixth Day of November, 2007

JON W. DUDAS
*Director of the United States Patent and Trademark Office*